United States Patent
Afridi et al.

(10) Patent No.: US 11,418,165 B2
(45) Date of Patent: Aug. 16, 2022

(54) MATCHING NETWORKS, INDUCTORS, AND COUPLED-INDUCTOR CAPACITIVE WIRELESS POWER TRANSFER CIRCUIT AND RELATED TECHNIQUES

(71) Applicant: The Regents of the University of Colorado, Denver, CO (US)

(72) Inventors: Khurram Afridi, Boulder, CO (US); Brandon Regensburger, Lafayette, CO (US); Sreyam Sinha, Boulder, CO (US); Ashish Kumar, Boulder, CO (US)

(73) Assignee: The Regents of the University of Colorado, Denver, CO (US)

(*) Notice: Subject to any disclaimer, the term of this patent is extended or adjusted under 35 U.S.C. 154(b) by 0 days.

(21) Appl. No.: 16/357,291

(22) Filed: Mar. 18, 2019

(65) Prior Publication Data
US 2019/0319600 A1 Oct. 17, 2019

Related U.S. Application Data

(60) Provisional application No. 62/644,246, filed on Mar. 16, 2018.

(51) Int. Cl.
| | |
|---|---|
| *H03H 7/38* | (2006.01) |
| *H02J 50/05* | (2016.01) |
| *B60L 53/30* | (2019.01) |
| *B60L 53/12* | (2019.01) |
| *H01F 27/28* | (2006.01) |
| *H02J 7/02* | (2016.01) |

(52) U.S. Cl.
CPC ............. *H03H 7/38* (2013.01); *B60L 53/12* (2019.02); *B60L 53/32* (2019.02); *H01F 27/2823* (2013.01); *H02J 50/05* (2016.02); *H02J 7/025* (2013.01)

(58) Field of Classification Search
CPC . H03H 7/38; H02J 50/05; B60L 53/32; B60L 53/12; H01F 27/2823
USPC ........................................................ 307/9.1
See application file for complete search history.

(56) References Cited

U.S. PATENT DOCUMENTS

| | | | |
|---|---|---|---|
| 2018/0040416 A1* | 2/2018 | Lestoquoy | H01F 27/385 |
| 2018/0166915 A1* | 6/2018 | Afridi | H02J 7/025 |
| 2018/0204666 A1* | 7/2018 | Zhou | H01L 27/02 |
| 2019/0165616 A1* | 5/2019 | Lee | H02J 50/80 |

* cited by examiner

*Primary Examiner* — Ryan Jager
(74) *Attorney, Agent, or Firm* — FisherBroyles, LLP; Thomas J. Osborne, Jr.

(57) ABSTRACT

In one implementation, a matching network is provided comprising a pair of input terminals; a pair of output terminals; and at least two reactive components disposed between the pair of input terminals and the pair of output terminals. At least one of the reactive components comprises a coupled-inductor. In various implementations, the second reactive component can be a capacitor, and the capacitor can be at least partially realized using the parasitic capacitances of the environment. The matching network may be disposed in a capacitive wireless power transfer (WPT) system. In other implementations, inductors and coupled-inductors are further provided. In some implementations, for example, an inductor, such as but not limited to a coupled-inductor, may comprise a toroidal or semi-toroidal core comprising foil wire interleaved without notches.

12 Claims, 19 Drawing Sheets

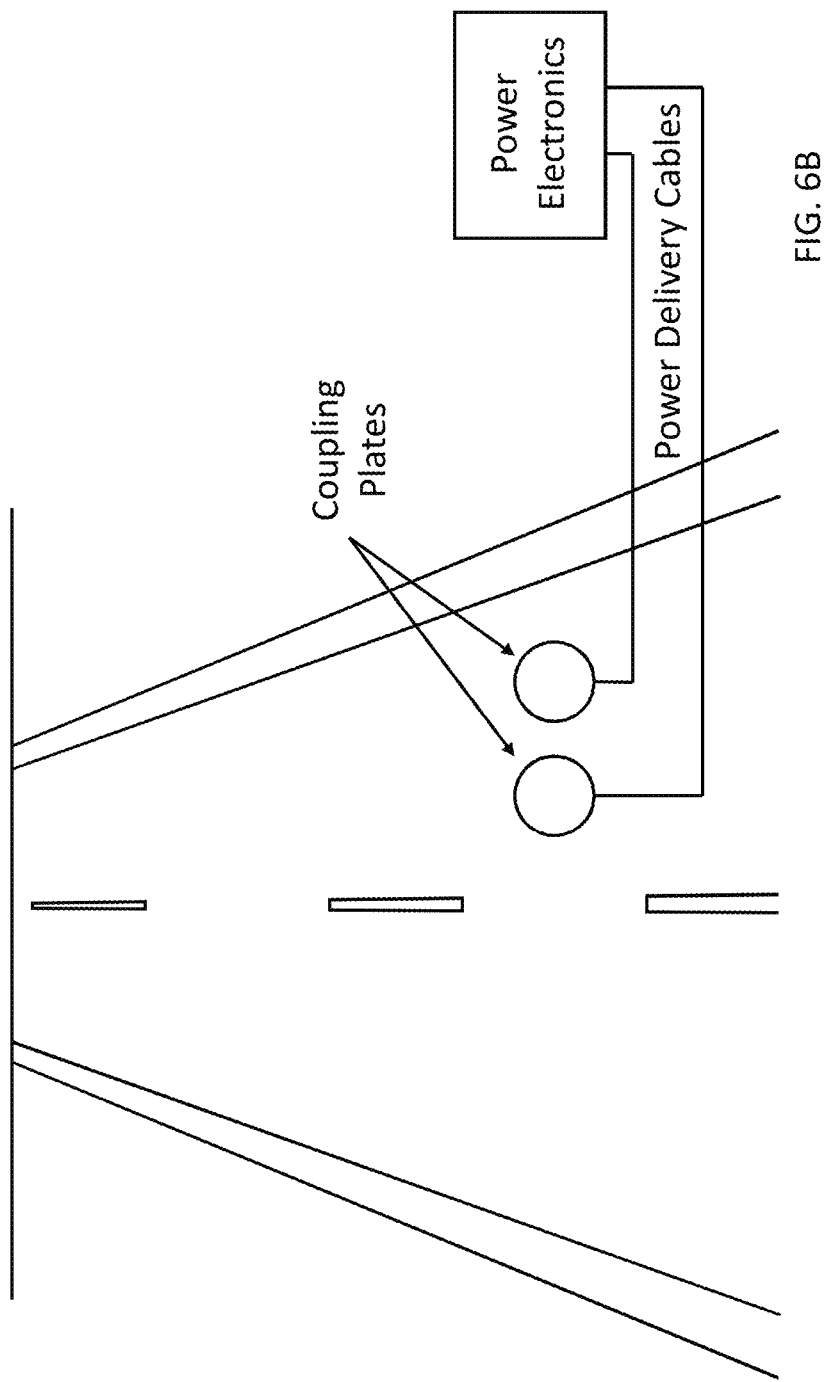

MATCHING NETWORKS, INDUCTORS, AND COUPLED-INDUCTOR CAPACITIVE WIRELESS POWER TRANSFER CIRCUIT AND RELATED TECHNIQUES

CROSS-REFERENCE TO RELATED APPLICATIONS

This application claims the benefit of U.S. provisional application No. 62/644,246, entitled "Air-Gap Capacitive Wireless Power Transfer System for Electric Vehicle Charging" and filed Mar. 16, 2018, which is hereby incorporated by reference as though fully set forth herein.

BACKGROUND a. Field

The instant disclosure relates to coupled inductor capacitive wireless power transfer circuits, components thereof, and techniques for controlling coupled inductor capacitive wireless power transfer circuits.

b. Background

Wireless power transfer (WPT) has utility in a vast array of applications, including electric vehicles (EVs), material handling equipment, robotics, unmanned aerial vehicles (UAVs), portable electronics, and biomedical implants. For example, wireless charging can eliminate the inconvenience associated with plugging in and the wear and tear of wires and connectors. By eliminating manual plug-in, WPT also makes self-driving EVs and UAVs truly autonomous. Furthermore, in-motion WPT can drastically lower EV cost by substantially reducing on-board energy storage, eliminate charging times, and enable unlimited range.

Near-field WPT approaches can either be inductive, or capacitive. Inductive WPT systems need ferrites for flux guidance and shielding. Ferrites are fragile, bulky, expensive, and introduce core losses that limit the operating frequency of such systems, and consequently, their potential for size reduction. In contrast, capacitive WPT systems use electrically coupled conductive plates for power transfer. Due to the relatively directed nature of electric fields, capacitive WPT systems do not require dielectric materials for flux guidance and can be efficiently operated at high frequencies, enabling reduced size and cost.

A key element of a capacitive WPT system is a matching network whose function is to provide voltage or current gain and reactive compensation. The inductors used in the matching networks are the major source of losses in WPT systems. Furthermore, they share the majority of the volume occupied by the transmitting-side and receiving-side power electronics. This disclosure presents a new approach to designing the matching network inductors that enables a significant improvement in system efficiency and a substantial reduction in the inductor volume.

BRIEF SUMMARY

In one implementation, a matching network is provided comprising a pair of input terminals; a pair of output terminals; and at least two reactive components disposed between the pair of input terminals and the pair of output terminals. At least one of the reactive components comprises a coupled-inductor. In various implementations, the second reactive component can be a capacitor, and the capacitor can be at least partially realized using the parasitic capacitances of the environment.

In one implementation, the matching network may be disposed in a capacitive wireless power transfer (WPT) system.

The coupled-inductor may comprise a flat wire. In variations, the coupled-inductor may comprise a plurality of parallel windings. For example, the coupled-inductor may be wound on a semi-toroid or toroid core, such as with interleaved wire (e.g., foil wire).

In some implementations, the matching network may comprise a multi-stage matching network utilizing coupled inductors. The coupled inductors can be coupled within stages of the matching network or in-between the multiple stages of the matching network.

In one implementation, a capacitive wireless power transfer (WPT) system is provided. The capacitive WPT system, in some implementations, may be adapted for providing wireless power transfer between a power source and a vehicle. The system may comprise, for example, a wireless power transfer circuit comprising two pairs of capacitive plates adapted to be coupled for capacitive wireless power transfer. A first pair of the capacitive plates can be disposed embedded in a roadway and a second pair of the capacitive plates can be disposed in the vehicle chassis. In one implementation, for example, a capacitive wireless power transfer (WPT) system may comprise power electronics on a source side disposed to a side of a road and inductance of a wire that connects the source side power electronics to first pair of capacitive plates can be used as part of a matching network.

Although particular examples are described herein with respect to road/vehicle capacitive WPT systems, one of skill in the art would readily appreciate that the systems and components described herein need not be so limited and could be applied to any capacitive WPT system. Further, particular components need not be limited to capacitive WPT systems at all.

In other implementations, inductors and coupled-inductors are further provided. In some implementations, for example, an inductor, such as but not limited to a coupled-inductor, may comprise a toroidal or semi-toroidal core comprising foil wire interleaved without notches.

In some implementations, in order to eliminate parasitic ground currents for example, the inductors in matching networks of high-frequency capacitive WPT systems can be split, with one half (or portion) placed in a forward path, and the other half (or portion) in a return path. This disclosure introduces a new approach to designing matching networks where the split inductors are coupled into a single magnetic structure. The coupled-inductor based matching network, in conjunction with a high operating frequency, significantly enhances the efficiency of a capacitive WPT system, and reduces its size. Efficiency can be further enhanced by realizing the matching network capacitors entirely using parasitic capacitances, thus eliminating the losses associated with on-board capacitors.

In one example implementation, a 13.56-MHz 12-cm air-gap prototype capacitive WPT system is designed, built and tested. This system transfers 884 W at an efficiency of 91.3%, achieving a power transfer density of 29.5 kW/m². Additionally, the prototype system achieves a peak efficiency of 95% when transferring 348 W. Compared to a prototype 6.78-MHz split-inductor capacitive WPT system, the 13.56-MHz coupled-inductor system exhibits up to 53% reduced losses and 69% reduced inductor volume.

The foregoing and other aspects, features, details, utilities, and advantages of the present invention will be apparent from reading the following description and claims, and from reviewing the accompanying drawings.

BRIEF DESCRIPTION OF THE DRAWINGS

FIG. 3A shows parasitic capacitances that exist in an actual EV charging environment with the coupling plates embedded in a vehicle chassis and a roadway. FIG. 3B shows the example schematic without the parasitic capacitances for clarity.

FIG. 4A shows the circuit incorporating parasitic capacitances, where nodes V and R represent the vehicle chassis and roadway respectively, and FIG. 4B shows the circuit matching circuits incorporating parasitic capacitances by enforcing circuit symmetry by splitting the matching network inductors.

FIGS. 6A and 6B show example implementations of capacitive WPT systems with the power electronics installed at the side of the roadway. In these configurations, the inductance of one or more power delivery cables can contribute to or fully implement the required matching network inductance.

FIG. 7 shows inverter switch node voltages and currents, and FIG. 8 shows system input voltage and current, and the output voltage.

DETAILED DESCRIPTION

Figure 1:
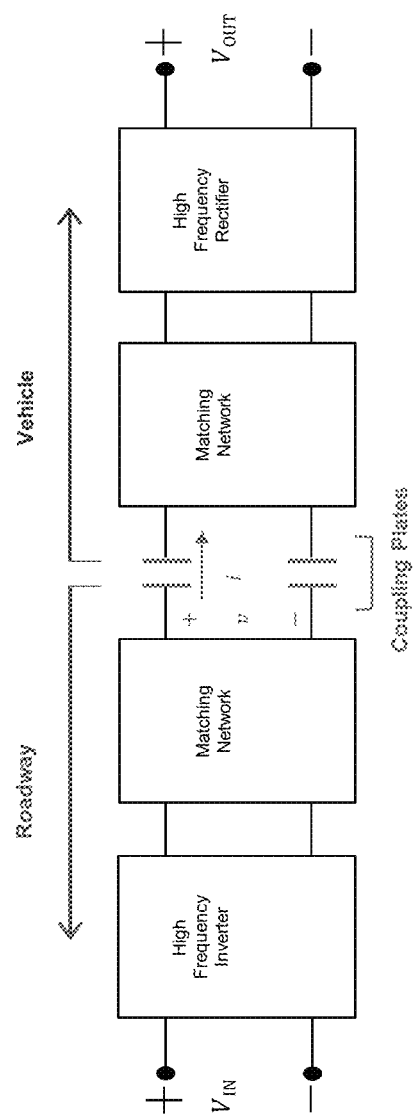
FIG. 1 shows an example implementation of a system architecture of a large air-gap capacitive WPT system, such as suitable for EV charging applications. The system comprises two pairs of coupling plates, a high-frequency inverter and rectifier, and matching networks that provide voltage or current gain and reactive compensation.
Figure 2:
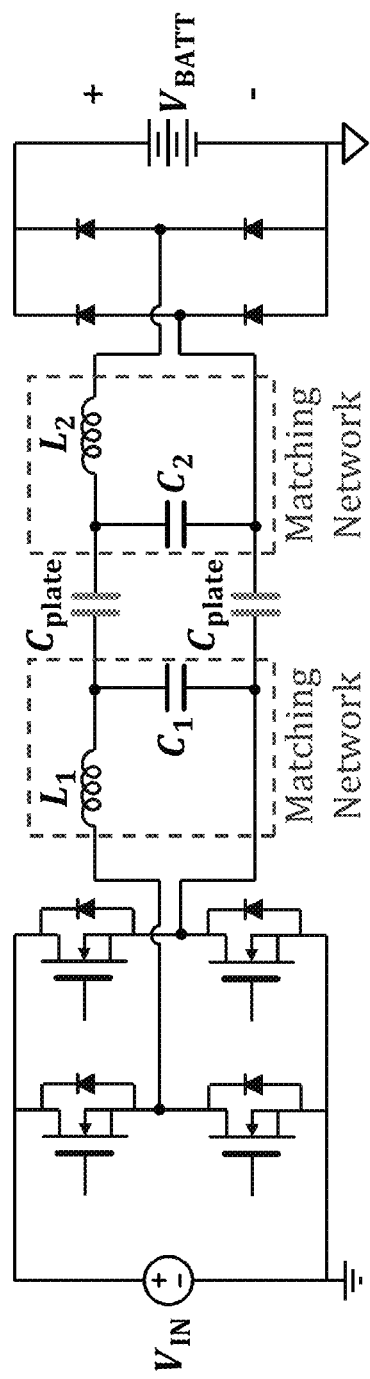
FIG. 2 shows an example implementation of a capacitive WPT system.

An example architecture of a capacitive WPT system for EV charging is shown in FIG. 1. In this example, the system transfers energy across an air gap, from one pair of conductive plates (e.g., embedded in the roadway, garage floor or the like) to another pair (e.g., attached to an underside of a vehicle chassis). The first, source side of the system (e.g., a roadway side) comprises a high-frequency inverter and a matching network. In this example, the matching network creates a high voltage at a roadway side of the coupling plates (shown as v in FIG. 1), enabling high power transfer with low displacement currents (shown as i in FIG. 1), and thus, low fringing fields. This network also partially compensates for the capacitive reactance of the coupling plates. The second, load side (e.g., a vehicle-side) of the system comprises a second matching network and a high-frequency rectifier. This matching network steps the voltage back down and the current back up to the levels required to charge the vehicle battery (or other load), and provides the remaining reactive compensation. An example implementation of the capacitive WPT architecture of FIG. 1 is shown in FIG. 2. In this particular implementation, the inverter and rectifier are implemented using full-bridge structures, and the matching networks are implemented as single-stage L-section networks.

Figure 3A:
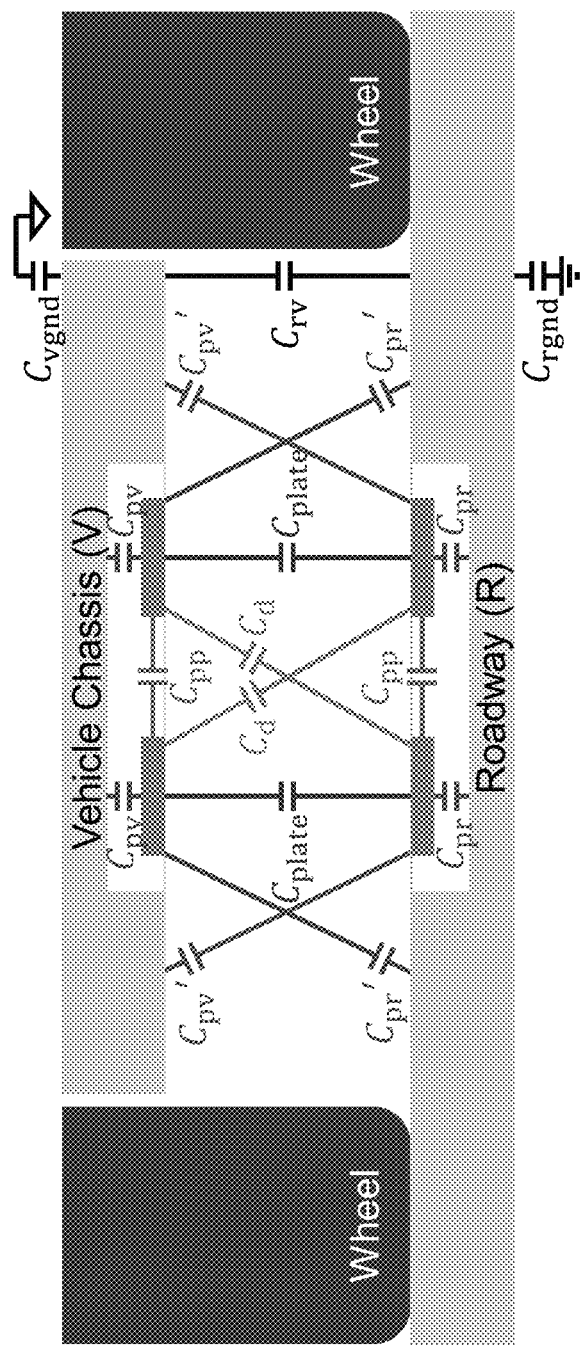
FIGS. 3A and 3B shows schematic views of an example implementation of a vehicle-based capacitive WPT system.
Figure 3B:
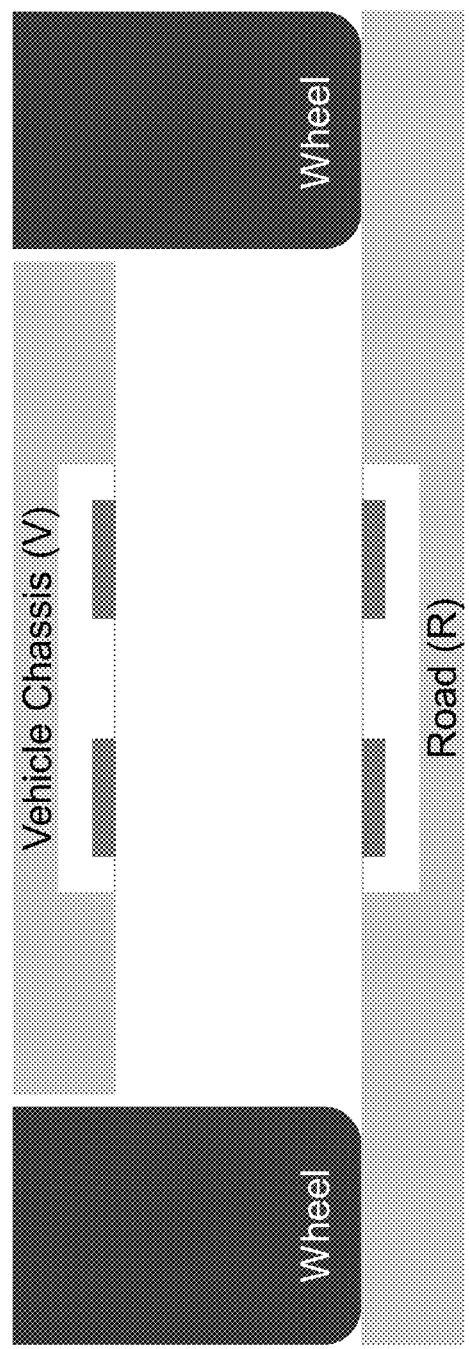

In an actual EV charging environment, there are parasitic capacitances between the coupling plates (e.g., plates embedded in a vehicle chassis to a vehicle chassis and roadway, and coupling plates embedded in the roadway to the vehicle chassis and roadway) as shown in FIG. 3A. These capacitances, in some systems, can be of the same order of magnitude as the coupling plate capacitance $C_{plate}$, and hence, can factor in the design of the system. FIG. 3B shows the schematic of the example capacitively coupled WPT plates embedded in a road and a vehicle chassis without the parasitic capacitances for clarity.

Figure 4A:
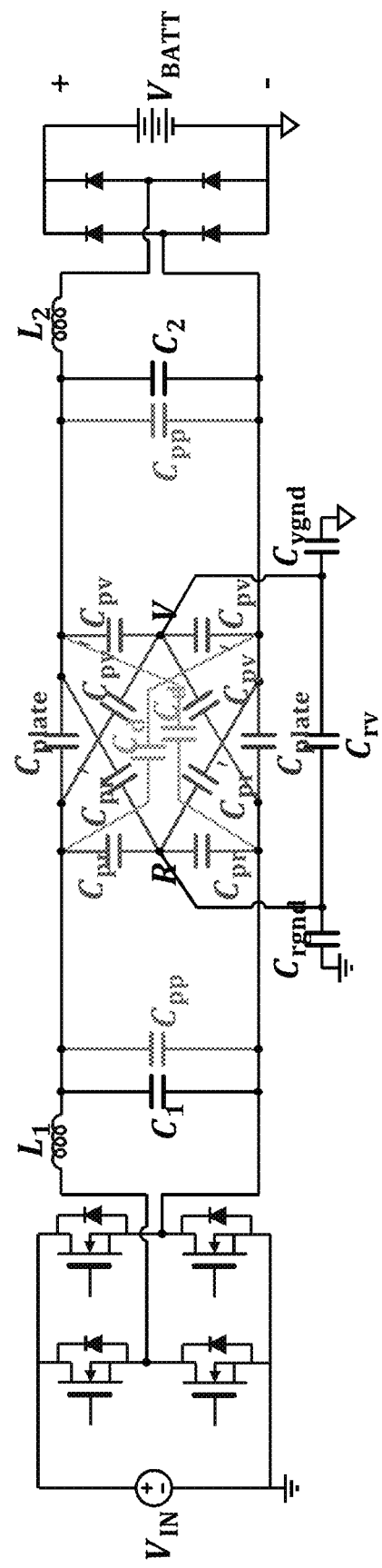
FIGS. 4A and 4B show circuit schematics of an example implementation of a capacitive WPT system.
Figure 4B:
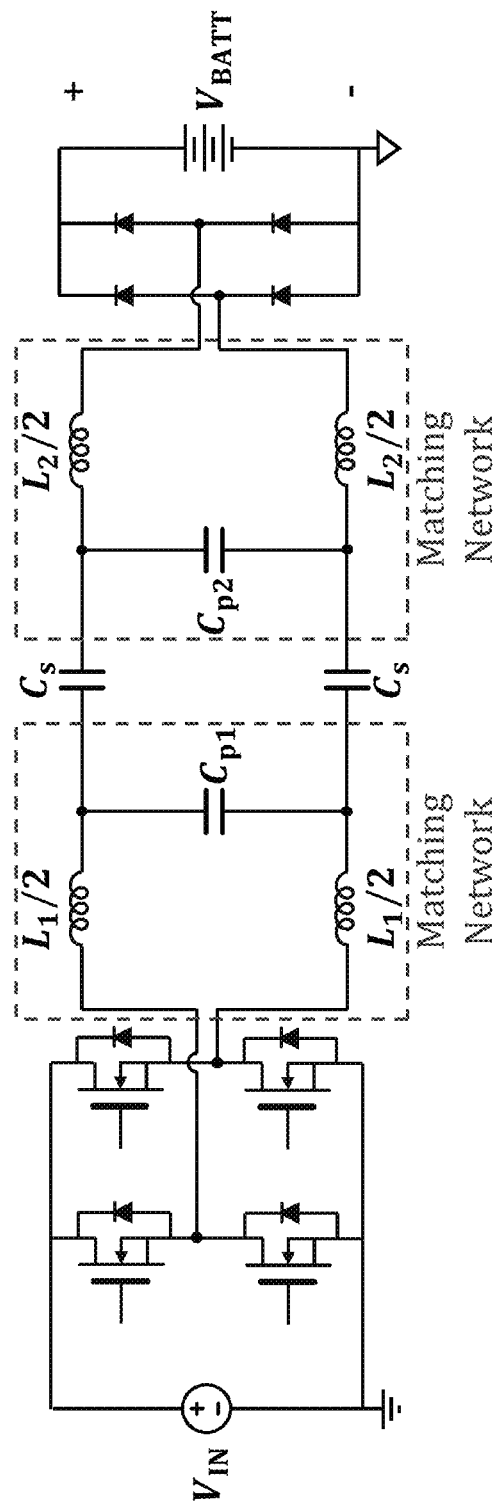

A schematic of an example capacitive WPT system incorporating the parasitic capacitances of FIG. 3A is shown in FIG. 4A. These parasitic capacitances can be absorbed into the matching networks of the system by enforcing circuit symmetry, wherein the matching network inductors are split into two equal halves, one placed in the forward path and the other in the return path. This circuit symmetry enforces zero volts across the vehicle-to-roadway capacitance $C_{rv}$, nullifying its effect. The complex network of parasitic capacitances can then be reduced to a 4-capacitance network through series and parallel combinations of the capacitances and by using two-port network theory. (See, e.g., S. Sinha, B. Regensburger, K. Doubleday, A. Kumar, S. Pervaiz and K. K. Afridi, "High-Power-Transfer-Density Capacitive Wireless Power Transfer System for Electric Vehicle Charging," *Proceedings of the IEEE Energy Conversion Congress and Exposition (ECCE)*, Cincinnati, Ohio, October 2017., which is incorporated by reference in its entirety.) Finally, the shunt capacitances of this network can be directly utilized as the matching network capacitors, as shown in FIG. 4(b). Here, $C_s(=C_{plate}-C_d)$ is the equivalent series capacitance, and $$C_{p1}\left(=C_{pp} + \frac{C_{pr}}{2} + \frac{C_{pv'}}{2} + C_d\right) \text{ and}$$

-continued $$C_{p2}\left(=C_{pp}+\frac{C_{pv}}{2}+\frac{C_{p\prime}}{2}+C_d\right)$$

are the shunt capacitances (in this example realized entirely using the parasitic capacitances). This can eliminate the need for on-board capacitors that are prone to dielectric breakdown, thereby simultaneously increasing system reliability while reducing system cost. The matching network capacitance values required in the system of FIG. 4B can be achieved by controlling the distances between the coupling plates and the vehicle chassis and roadway.

In a multi-MHz large air-gap capacitive WPT system, the largest fraction of losses is typically contributed by winding losses in the air-core inductors of the matching networks [8]. One approach to reducing these winding losses is to increase the operating frequency, and thereby lower the required inductance values. This approach can enhance the system's efficiency, provided two conditions are met: first, the quality factor of the inductors in the higher-frequency system should be comparable to that of the inductors in the lower-frequency system ($Q_{L,hi} \approx Q_{L,lo}$), and second, the inductance values should be reduced by a factor greater than the factor by which the frequency is increased $$\left(\frac{L_{lo}}{L_{hi}} > \frac{f_{hi}}{f_{lo}}\right).$$

Meeting these two conditions ensures that the ac resistance of the higher-frequency inductors is smaller than that of their lower-frequency counterparts, and hence, under the same operating conditions, the higher-frequency design has lower losses.

$$R_{ac,lo} > R_{ac,hi} \qquad (1)$$

$$\frac{2\pi f_{lo} L_{lo}}{Q_{L,lo}} > \frac{2\pi f_{hi} L_{hi}}{Q_{L,hi}} \qquad (2)$$

$$\frac{L_{lo}}{L_{hi}} > \frac{f_{hi}}{f_{lo}} \qquad (3)$$

In one particular example to validate the feasibility of this approach, matching networks for two capacitive WPT systems having the split-inductor topology shown in FIG. 4(b) are designed, one for 6.78 MHz operation and the other for 13.56 MHz operation. The inductance and capacitance values for the matching networks are obtained, such as using the optimization methodology presented in S. Sinha, A. Kumar, S. Pervaiz, B. Regensburger and K. K. Afridi, "Design of Efficient Matching Networks for Capacitive Wireless Power Transfer Systems," *Proceedings of the IEEE Workshop on Control and Modeling for Power Electronics (COMPEL)*, Trondheim, Norway, June 2016, which is incorporated by reference in its entirety. The inductances of the split-inductor matching networks in the 6.78-MHz system, in this example, come out to be $L_1=L_2=53$ µH, whereas those for the 13.56-MHz system come out to be $L_1=L_2=14.5$ µH. Therefore, the inductances are reduced by a factor of 3.65, while the frequency is increased only by factor of 2, satisfying the first condition for efficiency enhancement. Next, the split inductors for both systems are built as single-layer air-core solenoids using the guidelines prescribed in K. Doubleday, A. Kumar, S. Sinha, B. Regensburger, S. Pervaiz and K. K. Afridi, "Design Tradeoffs in a Multi-Modular Capacitive Wireless Power Transfer System," *Proceedings of the IEEE PELS Workshop on Emerging Technologies: Wireless Power Transfer (WoW)*, Knoxville, Tenn., October 2016, which is incorporated by reference in its entirety, targeting the same inductor quality factor for both the 6.78-MHz and 13.56-MHz designs. The 6.78-MHz inductors are measured to have a quality factor of 602, while the 13.56-MHz inductors have a quality factor of 598. Hence, the second condition for efficiency enhancement is also satisfied. Based on the inductance values and quality factors, the ac resistance of the 13.56-MHz inductors is estimated to be 43.8% lower than of the 6.78-MHz inductors. The resultant efficiency enhancement is thus experimentally validated through two prototype capacitive WPT systems, as described in the next section.

Figure 5:
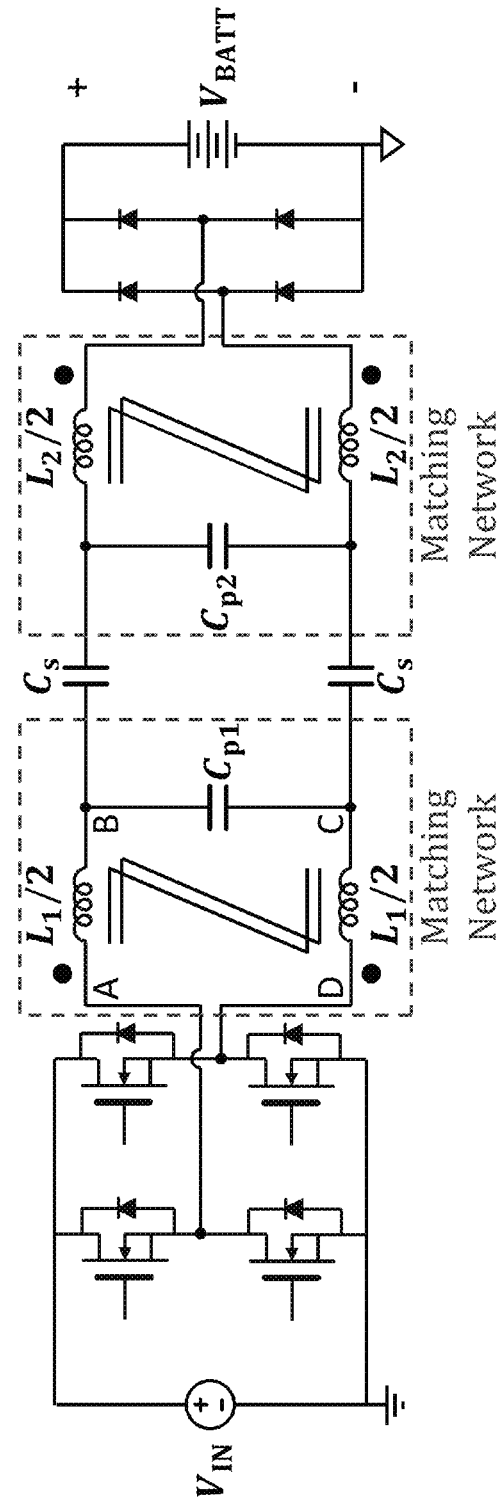
FIG. 5 shows an example implementation of a capacitive WPT system in which a source-side matching network and a load-side matching network each utilizes utilizing a coupled inductor.
Figure 6A:
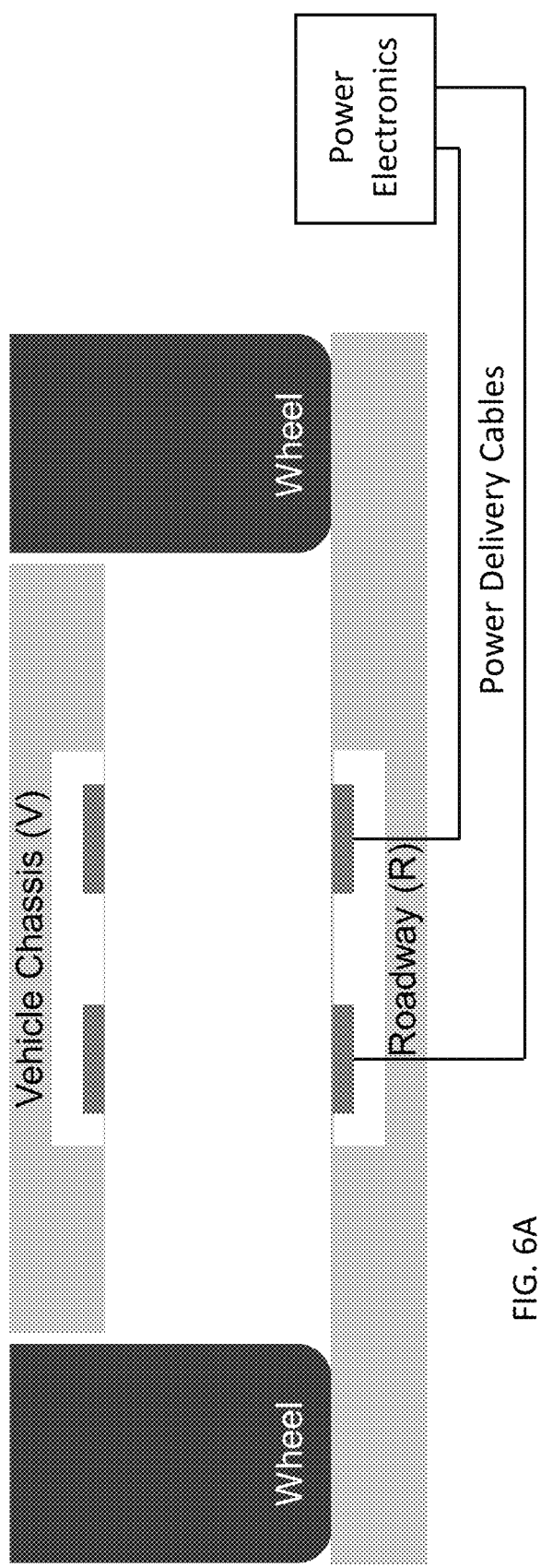

Since the above-described efficiency enhancement approach involves an increase in the operating frequency, it naturally also results in a reduction in inductor size. The capacitive WPT system's efficiency can be further improved, and its inductor size further reduced, by coupling the split inductors in the system of FIG. 4(b), as shown in FIG. 5. The two inductors on either side of the system (roadway/vehicle) are wound on a common tube, such that the flux in one winding reinforces the flux in the other. This increases the effective inductance of the combination, allowing fewer total turns to be utilized for the same required inductance. Hence, the inductor losses and size are both reduced. To validate this, coupled inductors for a 13.56-MHz capacitive WPT system are designed and built. These inductors have the same effective inductance as the total inductance of the 13.56-MHz split-inductor system described above, but have a higher quality factor than both the 13.56-MHz split inductors (710 vs. 598) and the 6.78-MHz split inductors (710 vs. 602). The resultant efficiency benefits are demonstrated in the next section. The 13.56-MHz coupled inductor has 69% lower volume than its 6.78-MHz uncoupled counterparts. An alternative to split-inductors or coupled-inductors, the inductance required for the matching network of FIG. 4(b) can be partially or fully implemented by the inductance of the power delivery cables (connecting the coupling plates to the power electronics), as shown in FIGS. 6A and 6B. A benefit of the configurations of FIGS. 6A and 6B is the power electronics can be installed at the side of the road, as opposed to being installed in the road.

Figure 7:
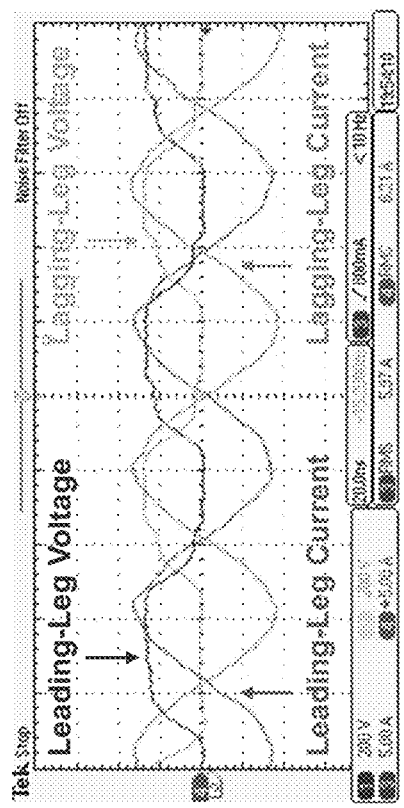
FIGS. 7 and 8 are graphs showing measured waveforms of a prototype capacitive WPT system operating at 884 W.
Figure 8:
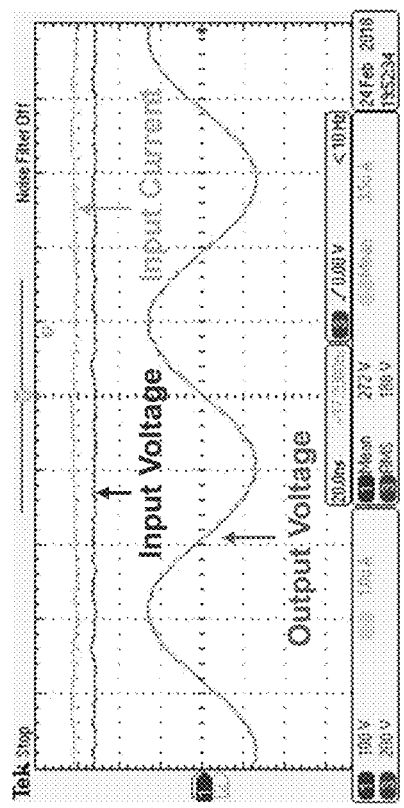
Figure 9:
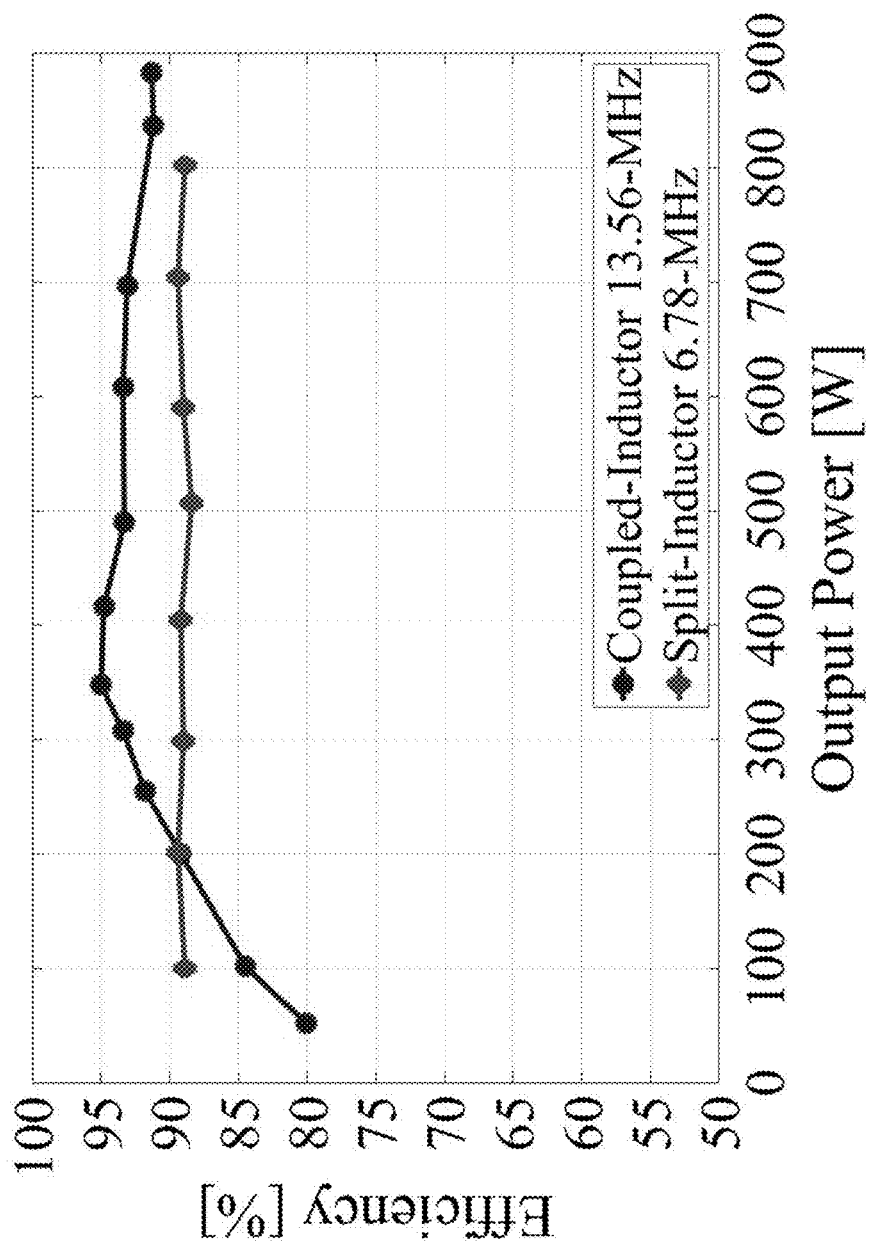
FIG. 9 is a graph showing measured efficiency of a coupled-inductor 13.56-MHz system and a split-inductor 6.78-MHz system as a function of output power.

A prototype 13.56-MHz 12-cm air-gap capacitive WPT system utilizing coupled inductors is designed, built and tested. This system is similar to those shown in FIG. 5, with one difference being that the rectifier and battery are emulated by an RF resistor. The inverter of the prototype system is constructed using 650-V 30-A GaN Systems GS66508T enhancement-mode GaN transistors. Measured waveforms of the prototype system while transferring 884 W are shown in FIGS. 7 and 8. It can be seen in FIG. 7 that the inverter operates with zero-voltage switching (ZVS). The measured efficiency of the coupled-inductor 13.56-MHz system is shown as a function of output power in FIG. 9. As can be seen, the prototype 13.56-MHz system achieves an efficiency of 95% at 348 W, and transfers 884 W at an efficiency of 91.3%, achieving a power transfer density of 29.5 kW/m². Also shown in FIG. 9 is the efficiency of a prototype 6.78-MHz system utilizing uncoupled split inductors. As can be seen, the 13.56-MHz system achieves significantly higher efficiency over most of the output power range, with up to 53% reduced losses, hence, validating the efficiency enhancement approaches discussed earlier Example Variants The coupled inductor presented above is merely an example of its numerous possible implementations. Some example implementations are provided below, with terminal markings A, B, C, and D aligning to how the coupled inductor is connected to the circuit of FIG. 5(a).

Figure 10:
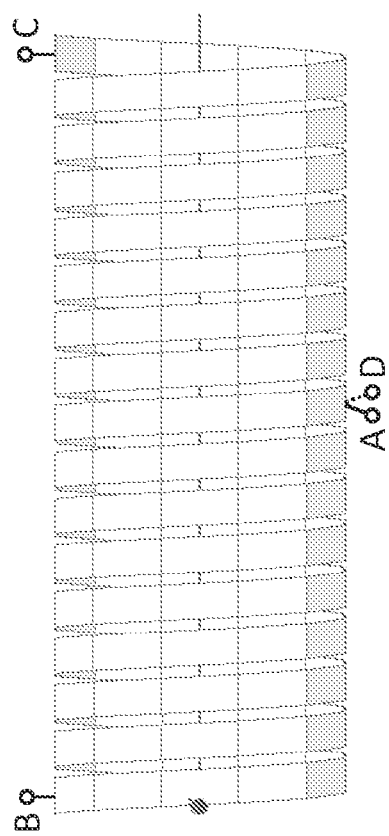
FIG. 10 shows an example implementation of a coupled inductor constructed with a flat wire.

FIG. 10 shows an example implementation of a coupled inductor constructed with a flat wire.

Figure 11:
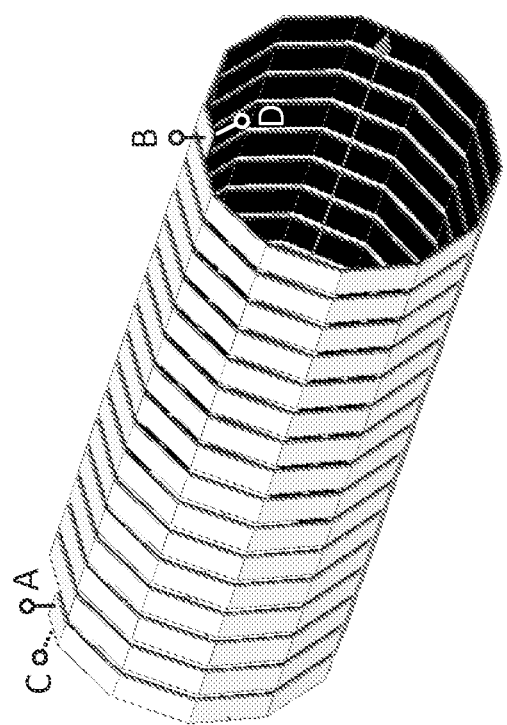
FIG. 11 shows an example implementation of a coupled inductor utilizing two parallel windings.

FIG. 11 shows an example implementation of a coupled inductor utilizing two parallel windings. In further implementations, two or more parallel windings may also be used.

Figure 12:
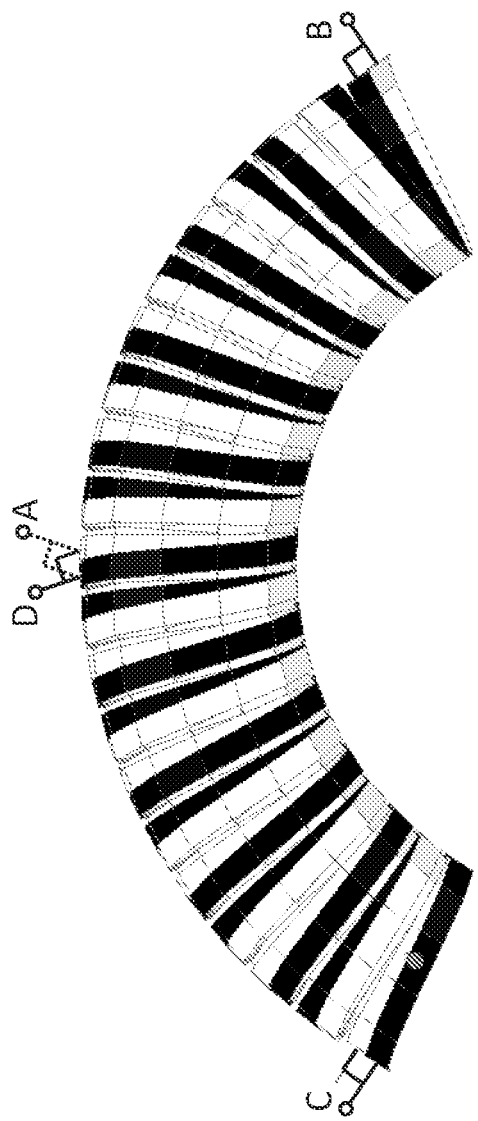
FIG. 12 shows another example implementation of a coupled inductor wound on a semi-toroid with interleaved-foil wire.

FIG. 12 shows another example implementation of a coupled inductor wound on a semi-toroid with interleaved-foil wire. The interleaved-foil wires, in this particular example, are connected in parallel and are shown in black and white.

Figure 13:
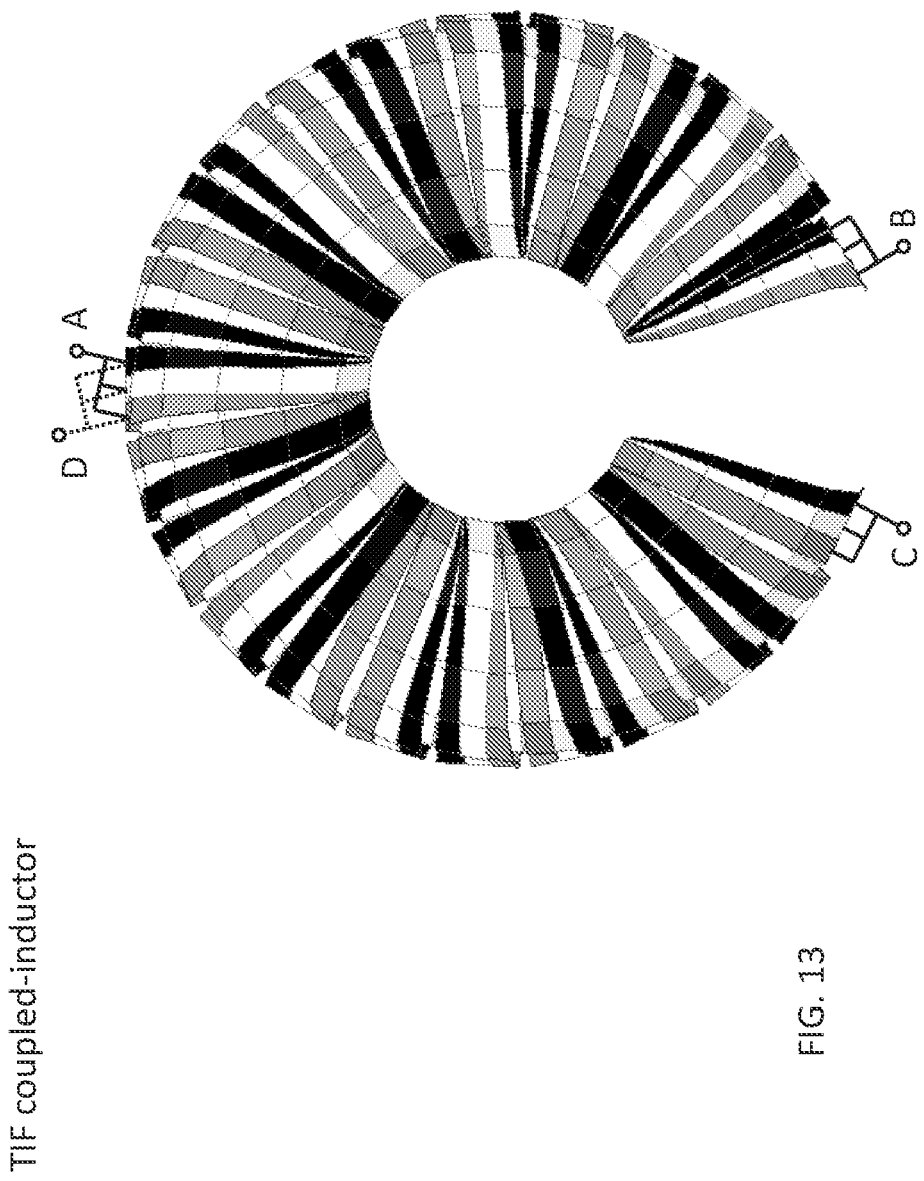
FIG. 13 shows yet another example implementation of a coupled inductor wound on a toroid with interleaved-foil wire.

FIG. 13 shows yet another example implementation of a coupled inductor wound on a toroid with interleaved-foil wire.

Figure 14:
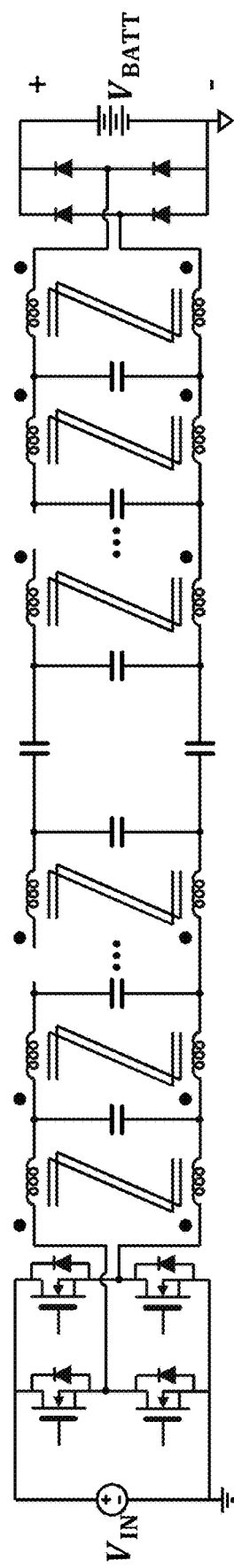
FIG. 14 shows an example implementation of a capacitive WPT system comprising multi-stage matching networks utilizing coupled-inductors.

FIG. 14 shows an example implementation of a capacitive WPT system comprising multi-stage matching networks utilizing coupled-inductors.

Figure 15:
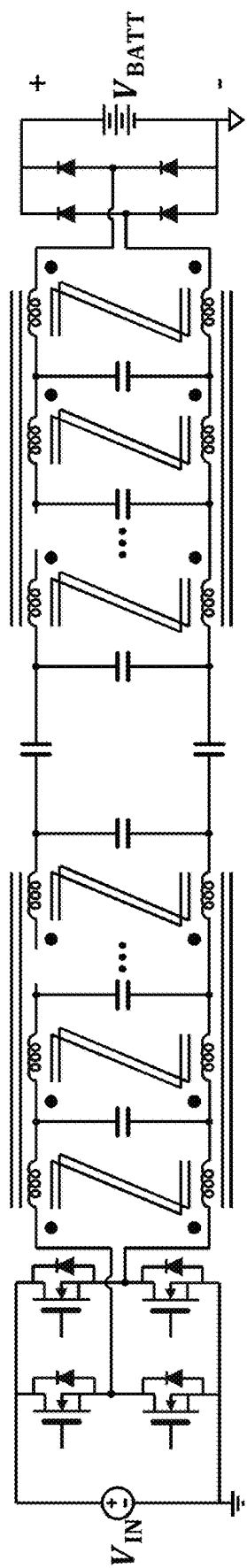
FIG. 15 shows another example implementation of a capacitive WPT system comprising multi-stage matching networks using coupled inductors with inductors of multiple stages of each of the matching networks coupled together.

FIG. 15 shows another example implementation of a capacitive WPT system comprising multi-stage matching networks using coupled inductors with inductors of multiple stages of each of the matching networks coupled together.

Figure 16:
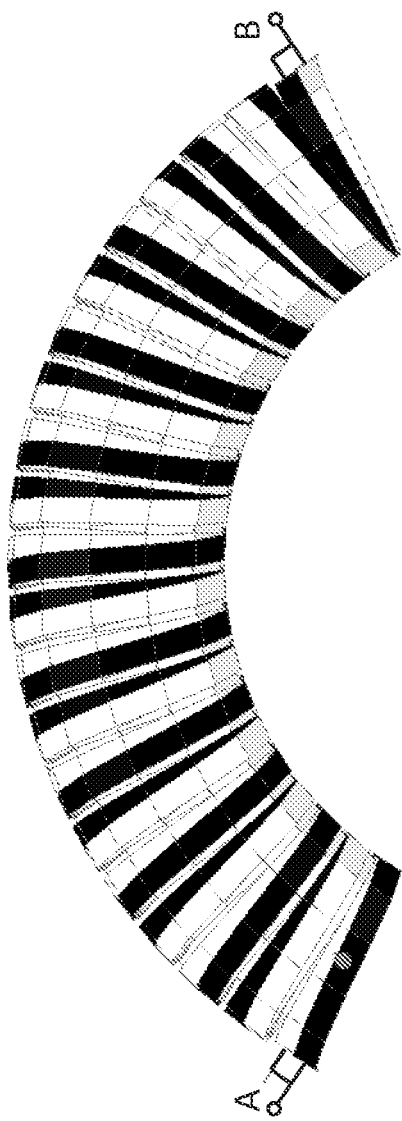
FIG. 16 shows an example implementation of an inductor wound on a semi-toroid with interleaved-foil wire.

FIG. 16 shows an example implementation of an inductor wound on a semi-toroid with interleaved-foil wire. The interleaved-foil wires are connected in parallel and are shown in black and white.

Figure 17:
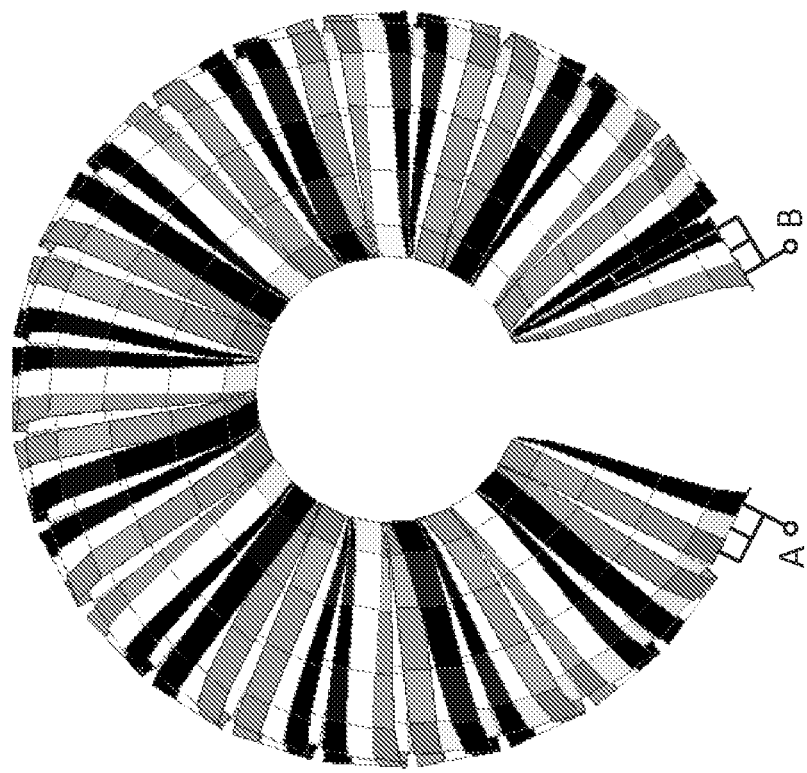
FIG. 17 shows another example implementation of an inductor wound on a toroid with interleaved-foil wire.

FIG. 17 shows another example implementation of an inductor wound on a toroid with interleaved-foil wire. The interleaved-foil wires are connected in parallel and are shown in black, gray and white.

The semi-toroidal interleaved-foil (STIF) coupled inductor, shown in FIG. 12, and the toroidal interleaved-foil (TIF) coupled inductor, shown in FIG. 13, are also new ways to implement an inductor, not just a coupled-inductor (for any application, not just for WPT). The Semi-toroidal interleaved-foil (STIF) inductor is shown in FIG. 16, and the toroidal interleaved-foil (TIF) inductor is shown in FIG. 17. The inductors of FIG. 16 and FIG. 17 have two terminals (A and B), as opposed to the coupled-inductors of FIG. 12 and FIG. 13 having four terminals (A, B, C, and D). Each of the two windings of the STIF coupled-inductor and SITF inductor can be realized using two insulated paralleled windings, which are interleaved in the following manner: along the inner-surface of the semi-toroid, the windings alternate positions (the black-white-black-white pattern in FIG. 12 and FIG. 16), while along the outer-surface, each turn occupies two consecutive positions (the black-white-white-black pattern in FIG. 12 and FIG. 16). This alternating interleaving arrangement allows a balanced distribution of high-frequency current among the paralleled windings, enabling the paralleling to not only halve the dc resistance, but also decrease the ac resistance. Each of the three windings of the TIF coupled-inductor and TIF inductor, in these particular examples, is realized using three insulated paralleled windings, which are interleaved in the following manner: along the inner-surface of the semi-toroid, the windings alternate positions (the gray-black-white-gray-black-white pattern in FIG. 13 and FIG. 17), while along the outer-surface, each turn occupies two consecutive positions (the black-white-gray-gray-white-black pattern in FIG. 13 and FIG. 17). This alternating interleaving arrangement allows a balanced distribution of high-frequency current among the paralleled windings, enabling the paralleling to not only reduce the dc resistance by a factor of 3, but also further decrease the ac resistance. Note that the semi-toroidal structure (shown in FIG. 12 and FIG. 16) and the toroidal structure (shown in FIG. 13 and FIG. 17) employed here has another benefit: the longer length of the outer-surface allows the paralleled windings to alternate along the inner-surface without the need for resistive notches. This further improves the efficiency benefit of this approach.

Although implementations have been described above with a certain degree of particularity, those skilled in the art could make numerous alterations to the disclosed embodiments without departing from the spirit or scope of this invention. For example, while particular implementations described herein are described with reference to vehicle/road capacitive WPT systems, any capacitive WPT system is contemplated and could be used with the implementations described herein. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A matching network comprising:
a pair of input terminals;
a pair of output terminals;
at least two reactive components disposed between the pair of input terminals and the pair of output terminals, wherein one of the reactive components comprises a coupled-inductor, the second reactive component is a capacitor, and the capacitor is at least partially realized using the parasitic capacitances of the environment,
wherein the coupled-inductor is wound on a semi-toroid core or a toroid core.

2. The matching network of claim 1, wherein the matching network is disposed in a capacitive wireless power transfer (WPT) system.

3. The matching network of claim 2, wherein the coupled-inductor comprises flat wire.

4. The matching network of claim 2, wherein the coupled-inductor is wound on a semi-toroid core with interleaved-foil wire.

5. The matching network of claim 2, wherein the coupled-inductor is wound on a toroid core with interleaved-foil wire.

6. The matching network of claim 1, wherein the coupled-inductor comprises flat wire.

7. The matching network of claim 1, wherein the coupled-inductor comprises two or more parallel windings.

8. The matching network of claim 1, claim 2, wherein the coupled-inductor comprises two or more parallel windings.

9. The matching network of claim 1, wherein the coupled-inductor is wound on a semi-toroid core with interleaved-foil wire.

10. The matching network of claim 1, wherein the coupled-inductor is wound on a toroid core with interleaved-foil wire.

11. The matching network of claim 1, wherein the matching network comprises a multi-stage matching network utilizing coupled inductors.

12. The matching network of claim 11, wherein the coupled inductors are coupled in-between the multiple stages of the matching network.

* * * * *